United States Patent [19]

Mieno

[11] Patent Number: 4,825,809

[45] Date of Patent: May 2, 1989

[54] CHEMICAL VAPOR DEPOSITION APPARATUS HAVING AN EJECTING HEAD FOR EJECTING A LAMINATED REACTION GAS FLOW

[75] Inventor: Fumitake Mieno, Kawasaki, Japan

[73] Assignee: Fujitsu Limited, Kawasaki, Japan

[21] Appl. No.: 163,733

[22] Filed: Mar. 3, 1988

[30] Foreign Application Priority Data

Mar. 17, 1987 [JP] Japan ................. 62-061811

[51] Int. Cl.$^4$ ............................................. C23C 16/44
[52] U.S. Cl. ................................. 118/725; 118/728; 118/715
[58] Field of Search ............... 118/715, 725, 50.1, 118/728; 156/611; 427/248.1

[56] References Cited

U.S. PATENT DOCUMENTS

| | | |
|---|---|---|
| 3,745,969 | 7/1973 | Huffman et al. ............ 118/730 |
| 4,499,853 | 2/1985 | Miller ........................ 118/725 |
| 4,649,859 | 3/1987 | Wanless ..................... 118/715 |

FOREIGN PATENT DOCUMENTS

| | | |
|---|---|---|
| 52-60570 | 5/1977 | Japan . |
| 60-189928 | 9/1985 | Japan ........................ 118/715 |
| 60-81093 | 5/1985 | Japan . |
| 61-87319 | 5/1986 | Japan ........................ 118/728 |
| 61-104080 | 5/1986 | Japan . |
| 61-135114 | 6/1986 | Japan ........................ 118/728 |

Primary Examiner—Evan Lawrence
Attorney, Agent, or Firm—Staas & Halsey

[57] ABSTRACT

A chemical vapor deposition apparatus for ejecting reaction gas over an object on which a layer of the reaction gas is to be deposited has an ejecting head which develops a uniformly distributed laminated flow of the reaction gas along its inner surface. The ejecting head is formed from an inverted conical housing portion and a circular perforated plate covering the open end thereof. An ejecting member protrudes into a top end of the head and ejects the gas into the space inside the head in predetermined directions. The housing encloses the ejecting member and directs the gas ejected from the ejecting member to flow downward along the inner surface thereof in a laminated state. The laminated flow of gas continues onto the perforated plate, on which it flows centripetally along the inner surface thereof, being ejected evenly downward from the plate through holes in the plate. As a result, a laminated flow of homogeneous reaction gas is ejected toward the object, growing a chemical vapor deposition layer of high quality over the object.

7 Claims, 5 Drawing Sheets

CHEMICAL VAPOR DEPOSITION APPARATUS HAVING AN EJECTING HEAD FOR EJECTING A LAMINATED REACTION GAS FLOW

BACKGROUND OF THE INVENTION

1. Field of the Invention

This invention relates to a chemical vapor deposition apparatus for depositing a chemical vapor film on a workpiece. Still more particularly, the present invention relates to an improved perforated head for a chemical vapor deposition apparatus, which ejects a reaction gas to form the film on a workpiece such as a silicon wafer.

2. Description of the Related Art

Chemical vapor deposition is a process for forming a stable solid by decomposition of chemical vapors using heat, plasma, ultraviolet light or other energy sources. In the following description, a chemical vapor deposition process using heat and a device therefor will be described. This process is widely employed in the fabrication of semiconductor devices, such as metal oxide silicon field effect transistors (MOSFETs). In the production of MOSFETs, a chemical vapor deposit is used to form a silicon epitaxial layer on a silicon wafer. The production yield and the quality of the finished semiconductor device depend on the quality and the uniformity of thickness of the silicon epitaxial layer formed by chemical vapor deposition thereon. It is well known that the hydrodynamical behavior of the relevant reaction gas is critical to the process. In view of this, the characteristics of the ejecting head of the chemical vapor deposition apparatus used for ejecting reaction gas onto the wafer are very important, particularly when the reaction gas flow is perpendicular to the surface of the wafer, as is the case in a low-pressure silicon epitaxial layer forming process. This is because the quality and uniformity of thickness of the silicon epitaxial layer formed thereby are a function of the flow of the reaction gas, which is substantially dependent on the hydrodynamical structure of the ejecting head.

FIGS. 1 and 2 are schematic, cross-sectional elevational views partially illustrating prior art low-pressure chemical vapor deposition apparatuses. In both prior art apparatuses, a bell jar 1 is set on a base plate 15, forming a reaction chamber 17 therewithin. A monocrystalline silicon wafer 3 is placed on a susceptor 4, which is mounted on a graphite heater 2. Reaction gas 7 is ejected downwardly, from a nozzle 5 in FIG. 1 and from a perforated head 6 in FIG. 2, onto the surface of the wafer 3 to form an epitaxial monocrystalline silicon layer on the wafer 3 through heating of the wafer 3 and deposited reaction gas.

The nozzle 5 of FIG. 1 is a simple nozzle pipe which ejects reaction gas 7. The ejected reaction gas 7 directly impinges upon the surface of the wafer 3. Gas molecules in the reaction gas flow arrive at the surface of the wafer 3 at the fastest rate at the center of the flow (and thus the center of the wafer 3 in FIG. 1). The arrival rate of the gas molecules declines toward the periphery of the flow (and the periphery of the wafer 3). The gas flow cools the wafer 3, the most cooling occurring at the center of the flow. This cooling decreases the thermal reaction rate of the reaction gas. As a result, an epitaxial silicon layer 12 formed on the wafer 3 is distributed as illustrated in the cross-sectional elevational view of FIG. 3, with the layer 12 being thickest in a ring immediately surrounding the center of the flow of the reaction gas 7 and decreasing in thickness out to the edges of the wafer 3.

The perforated head 6 of the apparatus of FIG. 2 represents an improvement over the nozzle 5 of FIG. 1 as a reaction gas ejecting means. The perforated head 6 comprises an inverted conical housing 10 having a perforated plate 8 closing the open end thereof. The reaction gas 7 is fed through a pipe 16 which is connected to the housing 10 at the top portion thereof. The perforated plate 8 has numerous small holes 9 therethrough in a matrix pattern The reaction gas 7 is injected from the pipe 16 into the housing 10, flows downwardly, unimpeded, toward the perforated plate 8 and is distributed through the holes 9 from which the gas is ejected onto the surface of the wafer 3.

The deposited silicon layer 13 on the wafer 3 has a satisfactorily uniform thickness, as illustrated in the cross-sectional elevational view of FIG. 4, but has a whitish, dull surface portion 18 in the vicinity of the center of the wafer 3. The generation of the dull surface is caused by the hydrodynamical behavior of the reaction gas 7 in the housing 10.

Molecules of the reaction gas 7 which are injected by the pipe 16 into the housing 10 pass through the holes 9 in the perforated plate 8, forming an ejection flow 11 beneath the perforated plate 8. However, a large quantity of the molecules injected by the pipe 16 impinge on the surface of the perforated plate 8, rather than passing directly through one of the holes 9 on their initial journey downward from the pipe 16. This impinging action is generally nearly perpendicular, and the gas molecules are partially reflected back by the surface of the plate 8. Especially when combined with the continuing downward flow of the reaction gas 7 from the pipe 16, a turbulent flow forms within the housing 10. The turbulent flow of the reaction gas tends to cause the premature formation of silicon particles 14 in the housing 10 rather than as a part of a monocrystalline silicon layer on the surface of the wafer 3. The silicon particles 14 are generated by collisions between the reaction gas molecules in the housing 10. These collisions occur easily when the gas flow is turbulent, even though the gas molecules have fairly long mean free paths at low reaction pressures. The prematurely generated silicon particles 14 eventually pass through the holes 9, join the flow 11 (the highest concentration being near the center of the flow 11) and reach the surface of the wafer 3.

As a result, the central surface 18 of the deposited epitaxial silicon layer 13 corresponding to the center portion of the perforated head 8 and the gas flow 11 has a rather rough surface and a whitish, dull appearance. The central portion 18 of the epitaxial silicon layer 13, moreover, has a polycrystalline structure which is grown due to the deposited silicon particles 14, which act as crystal growth nuclei. Meanwhile, the peripheral region of the deposited layer 13 has a mirror surface, which implies the desired mono-crystalline silicon structure. Achievement of the monocrystalline structure is ascribed to the slow flow rate of the reaction gas 7 in the region of the housing 10 above the peripheral region of the perforated plate 8. No turbulent back flow occurs in the peripheral region and as a result the ejection flow 11 to the surface of the wafer 3 above its corresponding peripheral region is even and contains no prematurely formed silicon molecules.

Therefore, it is clear that a uniformly distributed silicon reaction gas flow to the surface of the wafer 3 containing no silicon particles is desired. A perforated head for achieving such reaction gas flow, and more specifically a perforated head which generates thereinside a laminated gas flow for ejection onto a wafer, is clearly needed.

SUMMARY OF THE INVENTION

An object of the present invention is to provide a chemical vapor deposition apparatus capable of forming a uniformly distributed homogeneous chemical vapor deposition layer on the surface of a body.

Another object of the present invention is to provide a chemical vapor deposition apparatus with a perforated head capable of forming a laminated gas flow therein which can be uniformly ejected therefrom and uniformly distributed over the surface of a body.

Still another object of the present invention is to provide a low-pressure silicon epitaxial deposition apparatus capable of forming a homogeneous silicon epitaxial layer having a uniform thickness on a silicon wafer.

The present invention provides a perforated head comprising means for ejecting a reaction gas supplied from a gas source in predetermined directions; a housing having a smooth inner surface, enclosing the ejecting means, for forming a laminated gas flow from the ejected reaction gas along the inner surface thereof; and a perforated plate connected with the smooth inner surface and having a number of small holes facing an object to be processed. The reaction gas injected inside the housing is directed toward the inner surface of the housing, and forms a laminated flow along the inner surface of the housing. The laminated gas flows along the inner surface of a rounded lower peripheral portion of the housing contiguous the periphery of, and onto the perforated plate. The laminated gas flow is ejected from the plate through the small holes as it passes over the perforated plate, from its periphery and toward the center of the perforated plate. Thus, inside the perforated head, the reaction gas never flows perpendicularly to the surface of the perforated plate, but rather flows in parallel therewith and centripetally thereon. As a result, no turbulent flow occurs during the passage of the gas from its injection inside the housing to its ejection through the holes in the perforated head. Consequently, a homogeneous deposited layer having a uniform thickness is achieved on the surface of the object to be processed.

The objects and advantages of the present invention will become readily apparent from the following description of the preferred embodiments and claims, reference being had to the accompanying drawings, wherein like reference numerals represent like parts throughout.

DETAILED DESCRIPTION OF THE PREFERRED EMBODIMENTS

Figure 5:
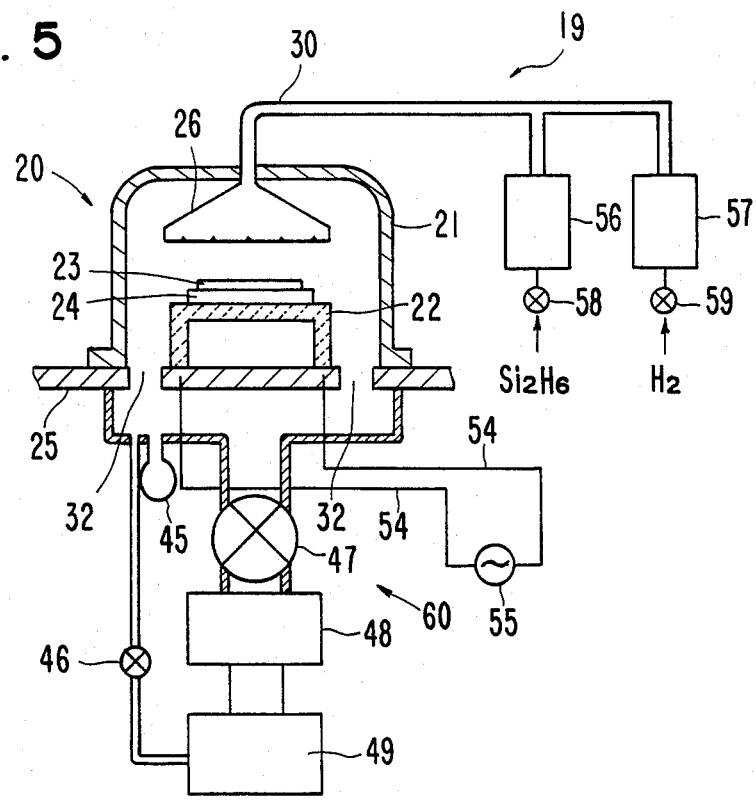
FIG. 5 is a schematic, cross-sectional generally elevational view of a low-pressure vapor deposition apparatus suitable for utilizing a perforated head in accordance with the preferred embodiments of the present invention.

A low-pressure vapor deposition apparatus 19 is schematically illustrated in FIG. 5. A reaction chamber 20 comprises a vacuum bell jar 21 which is mounted on a metallic base plate 25. The inner diameter of the bell jar 21 is approximately 30 cm and the inner height is approximately 60 cm. A single crystal silicon wafer 23, onto which a gas vapor layer is to be deposited, is placed on a susceptor 24. The susceptor 24 is mounted on a graphite heater 22. A controllable electric power source 55 supplies the graphite heater 22 with power through wires 54. A reaction gas mixture for vapor deposition is introduced into the reaction chamber 20 through a supply pipe 30 and is showered onto the wafer 23 through a perforated head 26 disposed downwardly and facing the wafer 23. The wafer 23 and the vapor-deposited layer thereon are heated by the heater 24, forming a monocrystalline silicon layer (not shown in FIG. 5) on the wafer 23.

The reaction gas mixture comprises disilane ($Si_2H_6$) gas, which is used as a silicon source gas, and hydrogen ($H_2$) gas, which is used as a carrier gas. The disilane and hydrogen gases are supplied from respective gas containers (not shown), and the supply and the flow rate thereof to the supply pipe 30 and perforated head 26 are controlled through gas valves 58 and 59 and mass-flow meters 56 and 57, respectively. These gas valves 58, 59 and mass-flow meters 56, 57 are arranged in parallel, as illustrated in FIG. 5.

Prior to the vapor depositing procedure, a conventional evacuating system 60 evacuates the reaction chamber 20 through several apertures 32 formed in the base plate 25. The gas pressure inside the reaction chamber 20 is controlled by the evacuation system 60, which comprises a mechanical booster pump 48, a rotary pump 49, a vacuum gauge 45, a leak valve 46, and a main vacuum valve 47, arranged as illustrated in FIG. 5.

Figure 8:
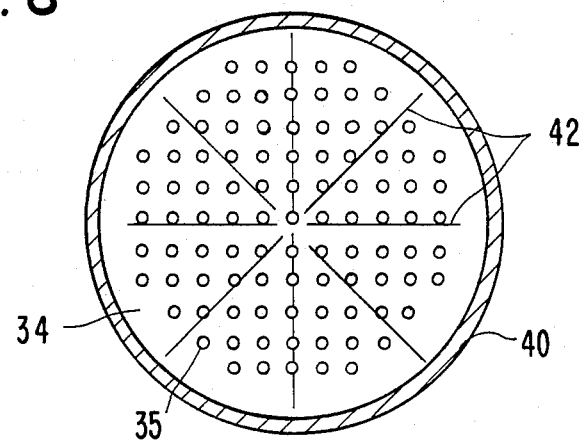
FIGS. 7 and 8 are bottom and top planar, partially cross-sectional views of a portion of the apparatus of FIG. 6, respectively taken along dot-dash lines II—II and III—III of FIG. 6, respectively.
Figure 6:
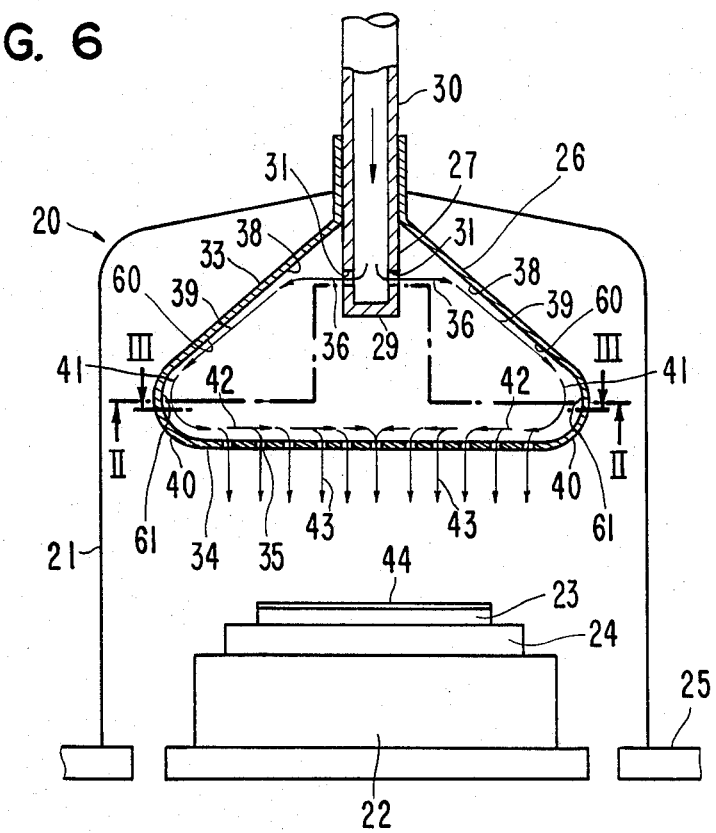
FIG. 6 is a cross-sectional elevational view illustrating a first embodiment of the perforated head according to the present invention.
Figure 7:
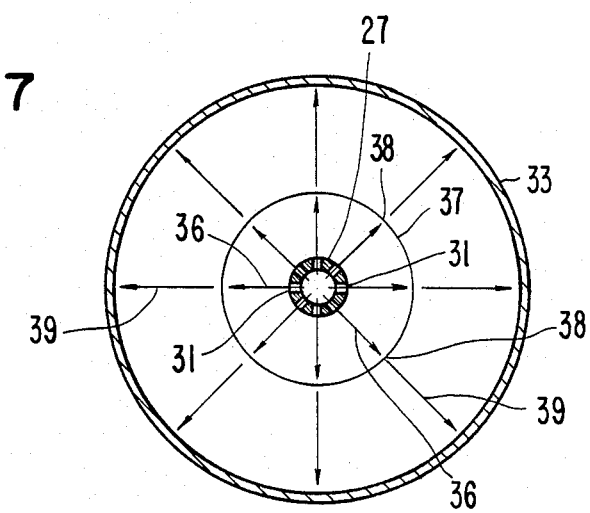

A first embodiment of the perforated head 26 according to the present invention is illustrated in cross-section in FIG. 6. FIGS. 7 and 8 are bottom and top planar, partially cross-sectional views of portions of the apparatus of FIG. 6 taken along dot dash lines II—II and III—III in FIG. 6, respectively. The perforated head 26 comprises a housing 33 having smooth inner surfaces 60 and 61, an ejecting pipe 27 which protrudes into the housing 33 for ejecting the reaction gas mixture therein, and a perforated plate 34 which closes the housing 33 and faces the wafer 23.

The housing 33 has a shape nearly like that of an inverted cone, having a top tipped end and an open, circular bottom portion. The ejecting pipe 27, which is essentially an extension of the supplied pipe 30, protrudes vertically a short distance into the housing 33 through the top end of the housing 33. The ejecting pipe 27 has a closed end 29 in the housing 33. In the vicinity of the closed end 29 are several ejecting holes or nozzles 31, which extend in radially outward directions and are equally spaced from each other by a fixed pitch angle in a plane perpendicular to the vertical axis of the ejecting pipe 27.

The upper inner surface 60 broadens as it extends downwardly from the top end of the housing 33. The lower inner surface 61 of the housing 33 near the open bottom end thereof is rounded inwardly. This is essential for assuring minimal disruption of the flow of the reaction gas along the inner surfaces 60, 61 of the housing 33, as is explained below. The lower inner surface 61 is rounded to the extent that it becomes nearly parallel to the wafer 23 and perpendicular to the ejecting pipe 27 at its lowermost edge, which then connects to the periphery of the perforated plate 34, which preferably is circular. The perforated plate 34 accordingly closes the open, bottom end of the housing 33. The perforated plate 34 is basically planar, and parallel to the wafer 23. A number of small holes or nozzles 35 are uniformly distributed in a matrix pattern through the perforated plate 34, as shown in FIG. 8.

Preferred dimensions for the perforated head 26 having the above described structure for depositing a film of the reaction gas on a four inch diameter wafer include the perforated plate 34 having a diameter of 150 mm, an inner diameter of 2 mm for each of the ejecting nozzles 35, and a thickness of 2 mm for the perforated plate 34. The material used for the housing 33 and the perforated plate 34 is quartz.

The behavior of reaction gas injected into the perforated head 26 is described below with reference to FIGS. 6 and 7. The reaction gas is ejected from the nozzles 31 in a uniform, radially outward direction, as is indicated by arrows 36. The ejected reaction gas impinges obliquely onto an interior circumferential portion 38 of the inner surface 60 of the housing 33, indicated by the circular line 37 in FIG. 7. At the interior circumferential portion 38, the direction of the gas flow changes from radial with respect to the ejecting pipe 27 to outward and downward along the inner surface 60 of the housing 33. At this point, the stream of reaction gas becomes a laminated flow; that is, the flow is compressed evenly against and along the inner surface 60 of the housing 33 below the portion 38. The gas flows downwardly along the inner surface 60, as indicated by arrows 39, to the lower inner surface 61. The flow changes direction smoothly along the rounded circular wall portion 40, as indicated by arrows 41. Thereafter, the gas flows centripetally along the top inner surface of the perforated plate 34, from its periphery toward its center, as shown by arrows 42. The gas still flows in a laminated flow state, and is evenly ejected toward the wafer 23 through the matrix of small nozzles 35 as the flow of gas passes over each nozzle 35, as shown by arrows 43. By the time the gas flow has reached the center portion of the perforated plate 34, almost the entire quantity of the reaction gas has been ejected through the nozzles 35 situated along the way. A small amount of the gas, at a minimal flow rate, proceeds to the center portion of the perforated plate 34 for ejection from the corresponding, centrally located nozzles 35. Consequently, no turbulent flow is caused inside the housing 33. As there is no turbulent flow inside the housing 33, the reaction gas ejected from the perforated head 26 toward the wafer 23 contains no silicon particles, which are, as described above, generated by a turbulent flow of the reaction gas with the prior art types of ejecting heads.

Thus, the reaction gas is ejected from the perforated plate 34 of the head 26 of the invention at a uniform flow rate and distribution, and flows perpendicularly to the wafer 23 on which it forms a uniformly distributed film across the entire surface. The wafer 23 is heated to a reaction temperature by the graphite heater 22 to form a substantially homogeneous, monocrystalline silicon epitaxial layer 44 having a uniform thickness on the wafer 23.

Figure 1:
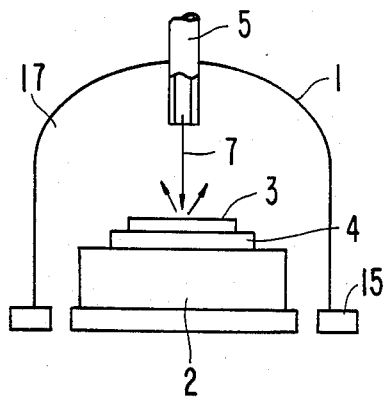
FIG. 1 is a schematic, cross-sectional elevational view illustrating a first type of prior art low-pressure chemical vapor deposition apparatus.
Figure 2:
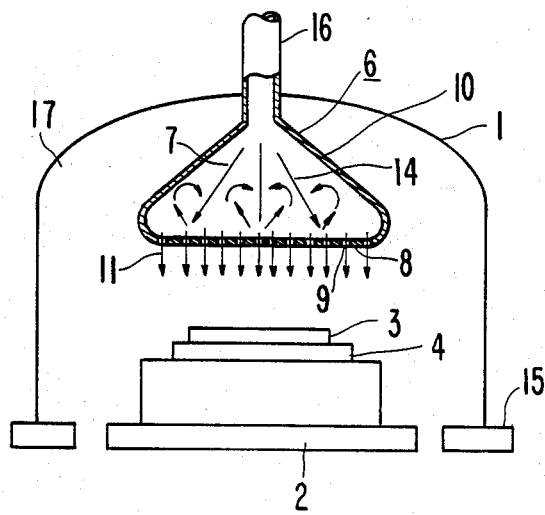
FIG. 2 is a schematic, cross-sectional elevational view illustrating a second type of prior art low-pressure chemical vapor deposition apparatus.
Figure 3:
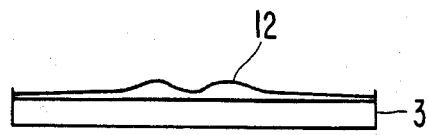
FIG. 3 is a cross-sectional elevational view of an epitaxial silicon layer formed on a wafer following a chemical vapor deposition process employing the apparatus of FIG. 1.
Figure 4:
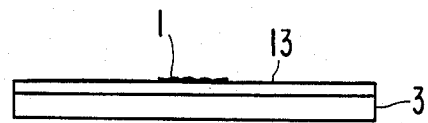
FIG. 4 is a cross-sectional elevational view of an epitaxial silicon layer formed on a wafer following a chemical vapor deposition process employing the apparatus of FIG. 2.

Results of silicon epitaxial growth experiments performed using the chemical vapor deposition apparatus of the present invention, as described above, are illustrated in the graph of FIG. 10. These results can be compared and contrasted to results from experiments employing the prior art perforated head of FIG. 2, as graphically shown in FIG. 9. In the graphs, the thickness of the silicon epitaxial layer is plotted on the ordinate in microns $\mu$m), and the position along a diameter of the wafer 23 is plotted on the abscissa in millimeters (mm). The chemical vapor deposition conditions for both experiments were as follows:
 reaction temperature
 (temperature of the wafer: 900° C.
 flow rate of disilane ($Si_2H_6$): 3 cc/min
 flow rate of hydrogen ($H_2$) gas: 10 l/min
 wafer diameter: 4 inches
 distance between perforated plate and wafer: 20 mm
 reaction gas pressure: 60 Torr The dimensions with respect to the perforated head were the same as those described above. The chemical vapor deposition time was 20 minutes.

Figure 9:
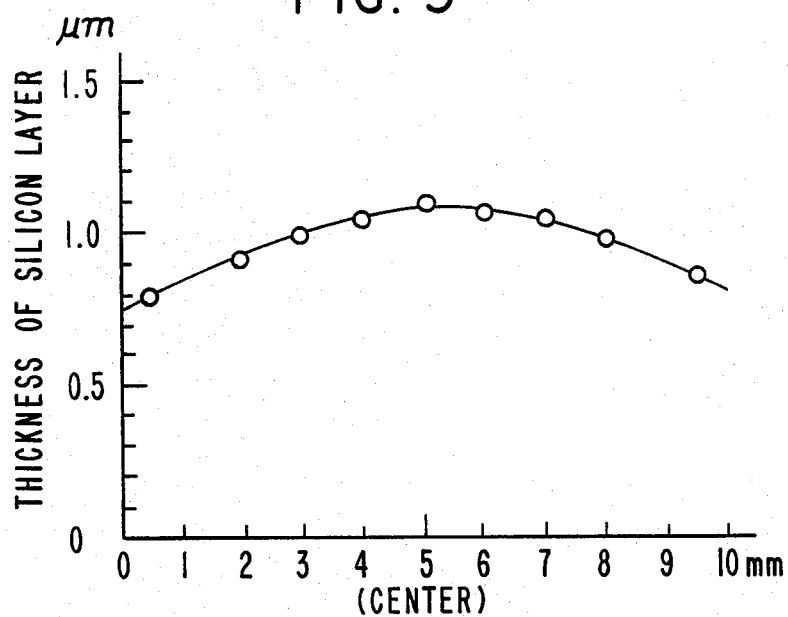
FIGS. 9 and 10 are diagrams illustrating the results of silicon epitaxial growth experiments performed employing the prior art perforated head of FIG. 2 and the perforated head of the present invention, respectively.
Figure 10:
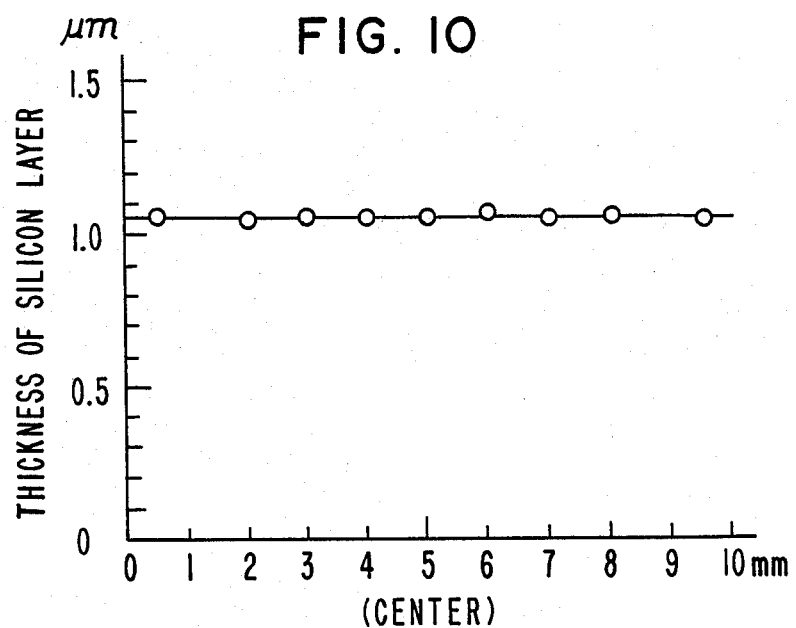

The deposited silicon epitaxial layer formed by using the prior art perforated head had a whitish, dull surface in the center portion of the layer, as described before. As shown in the graph of FIG. 9, the thickness variation was as large as 16% of the average thickness. On the other hand, as shown by FIG. 10, the silicon epitaxial layer formed using the perforated head of the first embodiment of the present invention had a mirror surface over the entire surface, and an essentially uniform layer thickness, the thickness variation remaining within a limit of 3% of the average thickness. By comparing the experimental results shown in FIGS. 9 and 10, it can be concluded that the perforated head of the first embodiment of the present invention is a substantial improvement over the prior art.

In the above-described perforated head 26 of the first embodiment, the ejection holes 31 are disposed in a plane perpendicular to the axis of the ejection pipe 27. However, in accordance with a second embodiment of the invention (not shown), the ejection holes 31 instead may be otherwise disposed, for example, inclining outwardly and downwardly in a conical plane toward the perforated plate 34. The impinging angle of the ejected reaction gas between the inner surface 61 of the housing 33 is thereby reduced. By reducing the impinging angle, an even smoother laminated reaction gas flow is formed.

Figure 11:
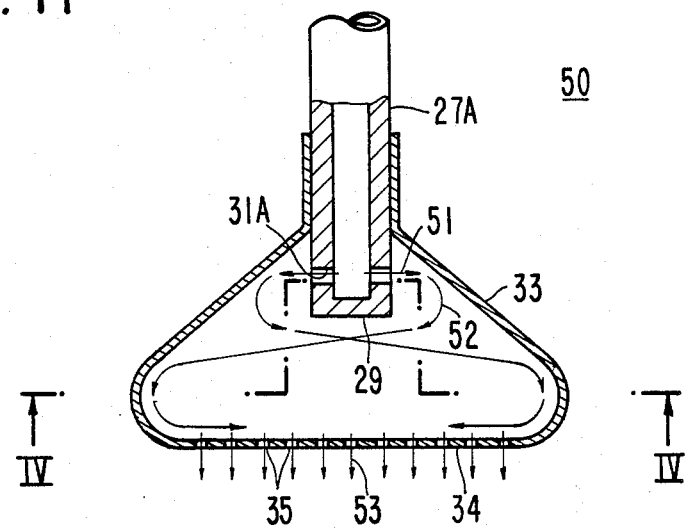
FIG. 11 is a cross-sectional elevational view illustrating a second embodiment of a perforated head according to the present invention.
Figure 12:
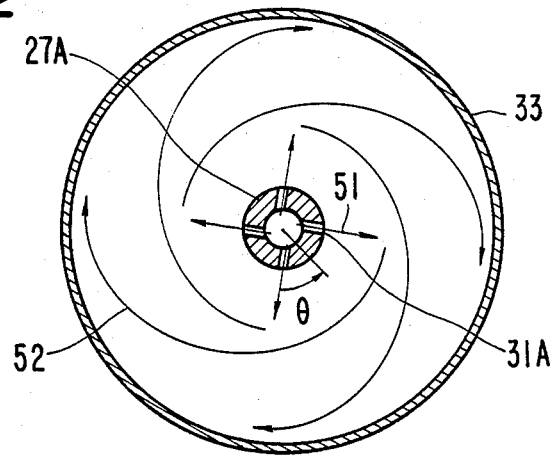
FIG. 12 is a bottom planar and partially cross-sectional view of a portion of the apparatus of FIG. 11, taken along dot-dash line IV—IV of FIG. 11.

Another second embodiment of a perforated head 50 according to the present invention is illustrated in cross-section in FIG. 11. The perforated head 50 is a modification of the perforated head 26 of the first embodiment. FIG. 12 is a bottom planar view taken along a dot-dash line IV—IV of the perforated head 50 illustrated in FIG. 11. The perforated head 50 includes the housing 33 and the perforated plate 34 of the first embodiment, as well as a modified ejecting pipe 27A. The ejecting pipe 27A descends into the housing 33 through the tip region of the housing 33, and has a closed end 29 in the housing 33. In the vicinity of the end 29, a number of off-center ejecting holes or nozzles 31A extend through the wall of the ejecting pipe 27A. The nozzles 31A are spaced apart from each other by a fixed pitch angle on a plane perpendicular to the axis of the ejecting pipe 27A. The direction of the axis of the nozzles 31A is deviated from the corresponding radial direction by a fixed angle $\theta$. Otherwise, the perforated head 50 is identical to the perforated head 26 of the first embodiment. As an alternative embodiment (not shown), the nozzles of the perforated head may be offset radially at a first fixed angle in addition to being angled downwardly at a second fixed angle from the horizontal.

As a result of the modifications to the ejecting pipe 27A, the reaction gas is ejected from the ejection pipe 27A in directions indicated by arrows 51 in FIG. 12. The non-radial ejection of the reaction gas from the ejecting pipe 27A causes the reaction gas to flow in a spiralling laminated flow along the inner surface 60 of the housing 33, as indicated by arrows 52. The reaction gas consequently flows centripetally along the surface of the perforated plate 34 in a spiral or eddy motion (not shown), and is ejected through the nozzles 35 of the perforated plate 34 as indicated arrows 53 of FIG. 11. The laminated reaction gas flow is more stable than the gas flow in the first embodiment and forms a more homogeneous epitaxial layer on the wafer 23 than the layer formed by using the perforated head 26 of the first embodiment.

Significant features of the perforated head according to the present invention include means for ejecting the reaction gas into the perforated head in predetermined initial directions, means for forming a laminated flow of the ejected reaction gas, and a perforated plate for receiving the laminated reaction gas flow and ejecting the flow from the perforated head.

The main goal of the present invention is to eliminate gas flow turbulence within the perforated head by maintaining the gas flow in a laminated stream. Accordingly, the shape of the housing need not be conical. For example, a spherical housing may be used in its place. Generally, however, it is desired that the perforated head be a rotatably symmetrical body. Further, the cross-sectional shape of ejecting holes 31 or 31A is not limited to circular, but can be square.

Although a perforated head according to the present invention has been described in relation to the growth of a silicon epitaxial layer on a wafer, the perforated head is also applicable to other chemical vapor deposition processes. For example, the perforated head of the present invention is also effective for eliminating a native oxide layer from the surface of a silicon wafer, in order to clean the surface prior to subsequent vapor deposition. In this process, a silicon wafer is heated to a high temperature and is showered with a hydrogen ($H_2$) gas flow from the perforated head. This eliminates the native oxide layer in a shorter time and with higher reliability as compared to a prior art perforated head. This is due to the homogeneous showering of hydrogen ($H_2$) gas permitted by the perforated head of the present invention.

The many features and advantages of the present invention are apparent from the detailed specification and thus, it is intended by the appended claims, to cover all such features and advantages of the apparatus which fall within the true spirit and scope of the invention. Further, since numerous modifications and changes will readily occur to those of skill in the art, it is not desired to limit the invention to the exact construction and operation illustrated and described. Accordingly, all suitable modifications and equivalents may be resorted to falling within the scope and spirit of the invention.

What we claim is:

1. An ejecting head for a chemical vapor deposition apparatus, for ejecting reaction gas onto a workpiece positioned horizontally beneath said ejecting head, comprising:

a housing having a top end, an open, bottom end defining a circular bottom edge, and a sidewall integrally joining the top and bottom end and defining therewith a smooth, continuous inner surface having an upper portion extending outwardly and downwardly from the top end and a lower portion curving inwardly to the circular bottom edge thereof, gas ejecting means, protruding into said housing means through the top end and sealed thereto, for ejecting the reaction gas into said housing in predetermined directions toward and onto the upper inner surface portion of the housing to form a uniform, laminated flow of the reaction gas on the upper inner surface portion which proceeds downwardly along the continuous inner surface and is redirected inwardly by the inwardly curving lower portion; and plate means having a periphery corresponding, and, continuously connected, to the circular bottom edge of said housing and having a matrix of the ejecting holes extending therethrough above the workpiece, the inwardly directed laminated flow of reaction gas proceeding radially inwardly thereover and being uniformly ejected downwardly onto the workpiece 2. An ejecting head for a chemical vapor deposition apparatus according to claim 1, wherein said housing has rotational symmetry about a vertical center axis thereof.

3. An ejecting head for a chemical vapor deposition apparatus according to claim 2, wherein said ejecting head approximates the shape of an inverted cone.

4. An ejecting head for a chemical vapor deposition apparatus according to claim 1, wherein said gas ejecting means comprises an ejecting pipe which protrudes vertically downwardly into said housing through the top end, said pipe having a closed end in said housing and a plurality of symmetrically disposed ejecting holes extending radially through said pipe adjacent the closed end and within the housing, for ejecting the reaction gas toward and onto the upper inner surface of said housing.

5. An ejecting head for a chemical vapor deposition apparatus according to claim 1, wherein said gas ejecting means comprises an ejecting pipe which protrudes vertically downwardly into said housing through the top end thereof, said ejecting pipe having a closed end and a plurality of ejecting holes in the vicinity of the closed end extending through said ejecting pipe.radially and at a predetermined downward angle for ejecting the reaction gas toward and onto the upper inner surface of said housing.

6. An ejecting head for a chemical vapor deposition apparatus according to claim 1, wherein said gas ejecting means comprises an ejecting pipe having a closed end and a plurality of symmetrically distributed horizontal ejecting holes extending through said pipe at a fixed angle off-set from a radial direction, for ejecting the reaction gas toward and onto the upper inner surface of said housing to form a spiraling laminated flow along the inner surface of said housing.

7. An ejecting head for a chemical vapor deposition apparatus according to claim 1, wherein said gas ejecting means comprises an ejecting pipe having a closed end and a plurality of symmetrically distributed ejecting holes extending through said pipe at a first fixed angle off-set from the a radial direction and downwardly at a second fixed angle from the horizontal, for ejecting the reaction gas toward and onto the upper inner surface of said housing to form a spiraling laminated reaction gas flow along the inner surface of said housing.

* * * * *